(12) United States Patent
Ueno

(10) Patent No.: US 8,206,815 B2
(45) Date of Patent: Jun. 26, 2012

(54) METAL-BASED COMPOSITE MATERIAL CONTAINING BOTH MICRON-SIZE CARBON FIBER AND NANO-SIZE CARBON FIBER

(75) Inventor: Toshiyuki Ueno, Matsue (JP)

(73) Assignee: Shimane Prefectural Government, Shimane (JP)

( * ) Notice: Subject to any disclaimer, the term of this patent is extended or adjusted under 35 U.S.C. 154(b) by 1065 days.

(21) Appl. No.: 12/085,551

(22) PCT Filed: Nov. 24, 2006

(86) PCT No.: PCT/JP2006/323399
§ 371 (c)(1),
(2), (4) Date: May 27, 2008

(87) PCT Pub. No.: WO2007/063764
PCT Pub. Date: Jun. 7, 2007

(65) Prior Publication Data
US 2009/0136707 A1    May 28, 2009

(30) Foreign Application Priority Data
Nov. 30, 2005    (JP) .................................. 2005-346367

(51) Int. Cl.
*B32B 7/02* (2006.01)
(52) U.S. Cl. ........... 428/220; 428/113; 428/212; 419/11
(58) Field of Classification Search .................. 428/113, 428/212, 220; 419/11
See application file for complete search history.

(56) References Cited

U.S. PATENT DOCUMENTS
6,013,371 A * 1/2000 Hager et al. .................. 428/408
2004/0131835 A1   7/2004 Schmitt et al.

FOREIGN PATENT DOCUMENTS
| EP | 1 696 046 A1 | 8/2006 |
|----|--------------|--------|
| EP | 1 703 302 A1 | 9/2006 |
| JP | A 2004-22828 | 1/2004 |
| JP | A 2004-165665 | 6/2004 |
| JP | A 2005-195417 | 7/2005 |
| JP | A 2005-200676 | 7/2005 |
| WO | WO 2005/059194 A1 | 6/2005 |
| WO | WO 2006/027879 A1 | 3/2006 |

OTHER PUBLICATIONS

Suzuki et al., "Heat Dissipation and Thermal Solutions for Electronic Devices: Furukawa Electric's Contribution," *Furukawa Review* (http://www.furukawa.co.jp/jiho/fj106/fj106_01.pdf), No. 106, Jul. 2000.

* cited by examiner

*Primary Examiner* — David R Sample
*Assistant Examiner* — Lawrence Ferguson
(74) *Attorney, Agent, or Firm* — Oliff & Berridge, PLC

(57) ABSTRACT

Disclosed is a metal-based carbon fiber composite material exhibiting an improved thermal expansion coefficient, improved thermal conductivity, and is smaller in weight, and a method for producing the same. The composite material includes a metal and a carbon fiber including a micron carbon fiber and a nanofiber; the composite material having a first surface; the micron-size carbon fiber being oriented in one direction parallel to the first surface and being continuous from end to end; at least 80% of the nanofiber being oriented at an angle within 30° with respect to the first surface; and the nano-size carbon fiber being oriented randomly in a plane parallel to the first surface. In the composite material, a surface region may include a smaller amount of micron carbon fiber than other regions, or include no micron carbon fiber; the nanofiber may have an orientation parallel to the surface of the composite material.

10 Claims, 8 Drawing Sheets

Z PLANE

X PLANE

APPARATUS FOR IMMERSING MICRON
CARBON FIBER IN SUSPENSION

FINE TEXTURE OF Al-15 wt% VGCF

MATERIAL CONTAINING NANOFIBER AND MICRON CARBON FIBER

METAL-BASED COMPOSITE MATERIAL CONTAINING BOTH MICRON-SIZE CARBON FIBER AND NANO-SIZE CARBON FIBER

TECHNICAL FIELD

The present invention relates to metal-based carbon fiber composite materials. More particularly, the invention relates to a metal-based composite material containing both micron-size and nano-size carbon fibers, and to a method for producing the metal-based composite material.

BACKGROUND ART

In recent years, the amount of heat generated by electronic devices such as a semiconductor device has been increasing. Take, for example, a CPU for personal computers, the amount of power consumption has increased at twice the rate in the past five years (Furukawa Review No. 106, http://www.furukawa.co.jp/jiho/fj016/fj106_01.pdf (Non-Patent Document 1)), accompanied by increases in the amount of generated heat.

In order to dissipate heat from such electronic devices, a heat dissipator such as a heatsink is generally used. When a heat dissipator is used for cooling, the thermal properties of the material for the heat dissipator greatly affect the cooling performance.

The first thermal property to which attention should be paid is the thermal conductivity, which is preferably high. A high thermal conductivity allows heat to be spread all over the heat dissipator, enabling the heat to be efficiently dissipated to the atmosphere.

The second thermal property to which attention should be paid is the thermal expansion coefficient, which is preferably equal to that of the material of the heat-generating device to be cooled. The heat from the heat-generating device is transmitted to the heat dissipator via contact; if there is a difference between the thermal expansion coefficients of the two, an ideal contact cannot be maintained, which hinders the normal heat transfer.

It is necessary that the heat dissipator material should meet the above requirements.

Aluminum and copper have typically been used as materials for heat dissipators. Aluminum and copper have thermal conductivities of about 200 W/(mK) and about 400 W/(mK), respectively, which are higher than those of general materials (iron: 84 W/(mK), stainless steel: 14 W/(mK), glass: 1 W/(mK), and resin: 1 W/(mK) or lower), while being inexpensive and having excellent workability. A material such as aluminum nitride (thermal conductivity: 250 W/(mK) or lower) or diamond (thermal conductivity: 800 to 2000 W/(mK)) is also used in a portion of a heat dissipator that requires insulating properties or an even higher thermal conductivity; however, the use of such expensive materials is not common.

Moreover, aluminum and copper have high thermal expansion coefficients (23 ppm/K and 17 ppm/K, respectively (both at room temperature (RT) to 100° C.)). On the other hand, silicon, which is a semiconductor material, has a low thermal expansion coefficient (2.6 ppm/K (RT to 100° C.)). For this reason, when aluminum or copper is brought into contact with silicon to allow heat dissipation, there is a difference between the thermal expansion coefficients of the two materials. Therefore, when aluminum or copper is used in a heat dissipator, a grease or the like is used in the contact portion to maintain the contact between the two materials; however, a grease has a thermal conductivity of about 1 W/(mK), which is the same as that of resin, and therefore becomes a large thermal resistance.

Metal-based carbon fiber composite materials have recently attracted attention as materials that are relatively inexpensive and have excellent thermal conductivity. Although these materials have a high thermal conductivity (500 W/(mK) or more) in the direction of a carbon fiber, they have a thermal conductivity as low as 40 W/(mK) or less in the direction perpendicular to the carbon fiber, and also show anisotropic thermal expansion coefficients (fiber direction: 0 ppm/K, direction perpendicular to the fiber: 14 ppm/K).

Japanese Patent Laid-Open Nos. 2004-165665 and 2004-22828 (Patent Documents 1 and 2) disclose composite materials of carbon fibers and metals. Each of the methods for producing metal-based carbon fiber composite materials disclosed therein is considered to be one in which a molten metal is incorporated into voids in a pre-molded carbon fiber by the application of pressure (a molten bath impregnation method). In particular, in neither of the aforementioned documents, a nanofiber is not incorporated in the matrix, and it is difficult to disperse a nanofiber in a metal using the methods disclosed therein (a nanofiber reacts with molten aluminum and molten magnesium, and the nanofiber does not mix with molten copper due to poor wettability). Moreover, WO 2005/059194 (Patent Document 3) discloses a method for producing a metal-based carbon fiber composite material, whereby the formation of metal carbide is prevented, and a metal-based carbon fiber composite material that is lightweight, has a high thermal conductivity, and is capable of controlling the direction of heat flow is produced. This method comprises the steps of physically mixing a carbon fiber and a metal powder to obtain a metal-fiber mixture; charging the metal-fiber mixture into a jig while orienting the metal-fiber mixture; and placing the jig in air, vacuum, or an inert atmosphere, directly passing a pulsed current through the jig while applying pressure, and sintering the mixture with the heat thereby generated. In this publication, the metal-fiber mixture is oriented in one direction, and there is no disclosure concerning the thermal properties of the mixture such as a thermal expansion coefficient.

Patent document 1: Japanese Patent Laid-Open No. 2004-165665
Patent document 2: Japanese Patent Laid-Open No. 2004-2282B
Patent document 3: WO 2005/059194
Non-Patent Document 1: Furukawa Review No. 106, http://www.furukawa.co.jp/jiho/fj106/fj106_01.pdf

DISCLOSURE OF THE INVENTION

The aforementioned metal-based carbon fiber composite materials, and in particular, high thermal conductive materials comprising a unidirectional carbon fiber (micron-size), require further improvements in terms of the thermal expansion coefficient and the thermal conductivity in the direction perpendicular to the carbon fiber. In addition, as electronic devices have decreased in size and weight, heat-dissipating members are also required to decrease in size and weight.

The present invention was made in order to solve these problems.

Accordingly, an object of the present invention is to provide a metal-based carbon fiber composite material which has an improved thermal expansion coefficient and an improved thermal conductivity in the direction perpendicular to a carbon fiber, and which is lighter in weight. The present invention also provides a method for producing such a metal-based carbon fiber composite material.

The present invention relates to a metal-based carbon fiber composite material that can be used as a material for heat dissipators and the like. The composite material of the invention is obtained by adding a combination of a carbon fiber with a diameter of from several to several tens of microns (also referred to as a "micron-size carbon fiber" or a "micron carbon fiber") and a nano-size carbon fiber with a diameter of from several to several hundreds of nanometers (also referred to as a "nanofiber") into a metal. The present invention makes it possible to achieve both a high thermal conductivity and a given thermal expansion coefficient in the composite material by controlling the orientation of each of the carbon fiber materials. The present invention also relates to a method for producing the metal-based carbon fiber composite material.

Specifically, a metal-based carbon fiber composite material according to a first embodiment of the present invention is a metal-based carbon fiber composite material comprising a metal; and a carbon fiber comprising a micron-size carbon fiber and a nano-size carbon fiber. The composite material is characterized in that it has a first surface; the micron-size carbon fiber is charged so as to be oriented in one direction parallel to the first surface of the composite material; at least 50% of the micron-size carbon fiber is continuous from one end of the first surface to an opposite other end; 80% of the nano-size carbon fiber is oriented at an angle within 30° with respect to the first surface; and the nano-size carbon fiber is oriented randomly in a plane parallel to the first surface. Another embodiment of the metal-based carbon fiber composite material of the present invention is characterized in that the metal-based carbon fiber composite material according to the first embodiment has a plurality of layers, and the composition of a material of each layer is at least partially different from one another. Still another embodiment of the metal-based carbon fiber composite material of the present invention is characterized in that the metal-based carbon fiber composite material according to the first embodiment comprises an inner region thereof at a certain distance from the first surface, the inner region comprising a smaller amount of the micron-size carbon fiber than that in another region, or being free of the micron-size carbon fiber; and the nano-size carbon fiber has an orientation parallel to the first surface of the composite material. In this embodiment, the other region may comprise a plurality of layers, and the composition of a material of each layer may be at least partially different from one another. The certain distance from the first surface is preferably from 10 µm to 5 mm from the surface. The composite material preferably comprises 20 to 80% by volume of the micron-size carbon fiber and 1 to 50% by volume of the nano-size carbon fiber.

A method for producing a metal-based carbon fiber composite material according to one embodiment of the present invention comprises the following steps of (a) mixing a metal powder and a nano-size carbon fiber to prepare a mixture of the metal powder and the nano-size carbon fiber; (b) causing the mixture of the metal powder and the nano-size carbon fiber to adhere to a micron-size carbon fiber to prepare a fiber adhered with the metal powder and the nano-size carbon fiber; (c) charging the fiber adhered with the metal powder and the nano-size carbon fiber into a jig while orienting the fiber; and (d) heating the jig to sinter the charged material.

A method for producing a metal-based carbon fiber composite material according to another embodiment of the present invention is a method for producing a metal-based carbon fiber composite material with a structure of two or more layers. The method comprises the following steps of (A) mixing a metal powder and a nano-size carbon fiber to prepare a mixture of the metal powder and the nano-size carbon fiber; (B) causing the mixture of the metal powder and the nano-size carbon fiber to adhere to a micron-size carbon fiber to prepare a fiber adhered with the metal powder and the nano-size carbon fiber; (C) charging the mixture of the metal powder and the nano-size carbon fiber or the fiber adhered with the metal powder and the nano-size carbon fiber into a jig while orienting the mixture or the fiber; heating the jig to sinter the charged material; and obtaining a sintered mixture of metal and nano-size carbon fiber or a sintered fiber adhered with the metal and the nano-size carbon fiber; (D) charging stepwise into a jig two or more materials selected from the mixture of the metal powder and the nano-size carbon fiber, the fiber adhered with the metal powder and the nano-size carbon fiber, the sintered mixture of metal and nano-size carbon fiber, and the sintered fiber adhered with metal and nano-size carbon fiber, to obtain a charged material having a plurality of layers; and (E) heating the jig to sinter the charged material.

In this embodiment, particularly in the step (D), two materials from the mixture of the metal powder and the nano-size carbon fiber or the sintered mixture of metal and nano-size carbon fiber and the fiber adhered with the metal powder and the nano-size carbon fiber or the sintered fiber adhered with metal and nano-size carbon fiber are charged stepwise into a jig. This allows the aforementioned metal-based carbon fiber composite material to be produced which comprises, in a certain region at a distance from a surface, a smaller amount of the micron-size carbon fiber than that in another region, or is free of the micron-size carbon fiber; wherein the nano-size carbon fiber has an orientation parallel to the surface of the composite material; and the certain region is at a distance of 10 µm to 5 mm from the surface.

In the present invention, the micron-size carbon fiber is preferably selected from a pitch-based carbon fiber, a PAN-based carbon fiber, and a vapor-grown carbon fiber; and the nano-size carbon fiber is selected from a vapor-grown carbon fiber, a multiwalled carbon nanotube, and a single-walled carbon nanotube. The metal is preferably selected from the group consisting of copper, aluminum, magnesium, and alloys based on these metals.

The present invention allows improvements in the thermal conductivity in the direction perpendicular to the micron-size carbon fiber, the thermal expansion coefficient and the like, which have been drawbacks to conventional metal-based carbon fiber composite materials, and in particular, to high thermal conductive materials comprising a unidirectional carbon fiber (micron-size). In addition, the composite material of the present invention can be lighter in weight.

| Description of Symbols | |
|---|---|
| 100 | metal-based carbon fiber composite material |
| 102 | micron-size carbon fiber |
| 104 | nano-size carbon fiber |
| 106 | metal |
| 110 | surface |
| 112 | surface |
| 114 | surface |
| 200 | metal-based carbon fiber composite material |
| 202 | surface region |
| 204 | other region |
| 206 | surface |
| 302 | unwinding bobbin |
| 304 | fiber bundles |
| 306 | stirrer |
| 308 | vessel |
| 310 | metal powder suspension |
| 312 | fiber adhered with nano-size carbon fiber |
| 314 | winding bobbin |
| 400 | pressure sintering vessel |
| 402 | die |
| 404 | lower punch |
| 406 | upper punch |
| 408 | platen |
| 410 | plunger |
| 412 | material |

-continued

| Description of Symbols | |
|---|---|
| 414 | power supply source |
| 602 | sintered product |
| 604 | sintered product |

PREFERRED EMBODIMENTS OF THE INVENTION

The present invention relates to a metal-based carbon fiber composite material comprising a metal and a carbon fiber. In the present invention, the carbon fiber comprises a micron-size carbon fiber and a nano-size carbon fiber.

Figure 1A:
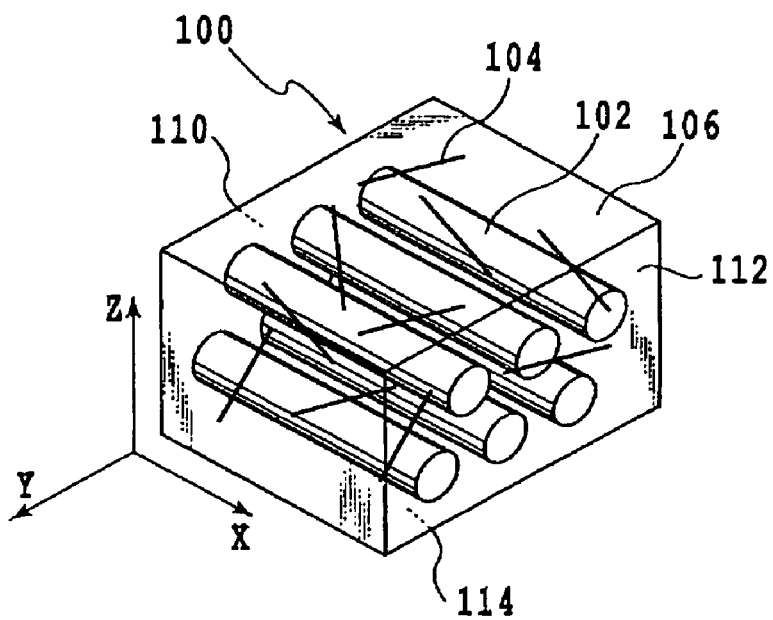
FIG. 1A is a schematic perspective view showing the structure of a metal-based carbon fiber composite material of the present invention.
Figure 1B:
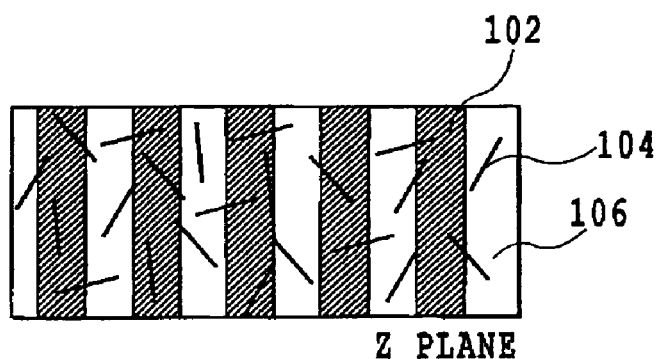
FIG. 1B is a schematic diagram showing the structure of the metal-based carbon fiber composite material of the present invention when viewed in the direction of the Z-axis shown in FIG. 1A.
Figure 1C:
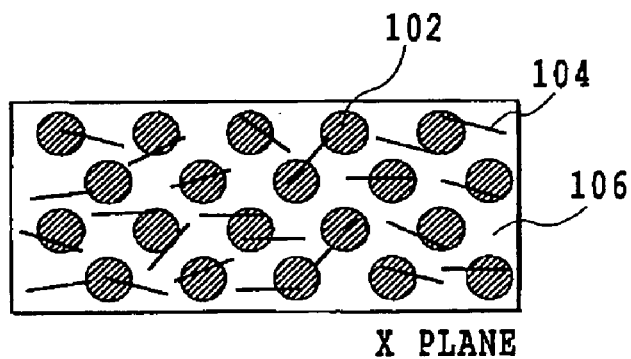
FIG. 1C is a schematic diagram showing the structure of the metal-based carbon fiber composite material of the present invention when viewed in the direction of the X-axis shown in FIG. 1A.

The metal-based carbon fiber composite material of the present invention will hereinafter be described, referring to FIGS. 1A to 1C, as an example of the first embodiment. FIG. 1A is a perspective view (which also schematically shows an inner structure) of a metal-based carbon fiber composite material of the invention. FIG. 1B is a diagram of the composite material when viewed in the direction of the Z-axis of the X-, Y- and Z-axes shown in FIG. 1A. FIG. 1C is a diagram of the composite material when viewed in the direction of the X-axis of the X-, Y- and Z-axes. While the description is given below using the coordinate axes shown in FIG. 1A, it should be noted that these axes are intended to designate the respective directions for convenience sake.

The metal-based carbon fiber composite material 100 of the present invention is a composite material comprising compound mixture of a micron-size carbon fiber 102, a nano-size carbon fiber 104, and a metal 106. In particular, the metal-based carbon fiber composite material 100 of the present invention comprises the micron-size carbon fiber 102 oriented in the direction of the X-axis in the metal matrix and the nano-size carbon fiber 104 dispersed in the metal matrix.

The micron-size carbon fiber 102 is continuous from one end of the composite material (the surface denoted by 110 in FIG. 1A, which is parallel to the Y-Z plane) to the other end (the surface denoted by 112 in FIG. 1A, which is parallel to the Y-Z plane). Preferably, 50% or more of the micron-size carbon fiber based on the total amount thereof is continuous.

As shown in FIG. 1B, the nano-size carbon fiber 104 is arranged in random directions in the plane perpendicular to the Z-axis. As shown in FIG. 1C, the nano-size carbon fiber 104 is characterized in that at least 80% thereof is oriented at an angle within 30°, and preferably at an angle within 10°, with respect to the plane perpendicular to the Z-axis (the X-Y plane shown in FIG. 1A).

The composite material of the present invention is thus characterized in that it has a first surface (for example, the surface 114 parallel to the X-Y plane shown in FIG. 1A); the micron-size carbon fiber is charged so as to be oriented in one direction parallel to the first surface of the composite material (for example, in the direction of the X-axis shown in FIG. 1A); at least 80% of the nano-size carbon fiber is oriented at an angle within 30°, and preferably within 10°, with respect to the first surface; and the nano-size carbon fiber is oriented randomly in the plane parallel to the first surface. In addition to the embodiment shown in FIGS. 1A to 1C, the present invention encompasses a case in which the composite material has a plurality of layers. In this case, the composition of the material forming each layer, which is a metal, a micron-size carbon fiber, or a nano-size carbon fiber, is different from one another.

The composite material preferably comprises 20 to 80% by volume of the micron-size carbon fiber and 1 to 50% by volume of the nano-size carbon fiber.

Figure 2A:
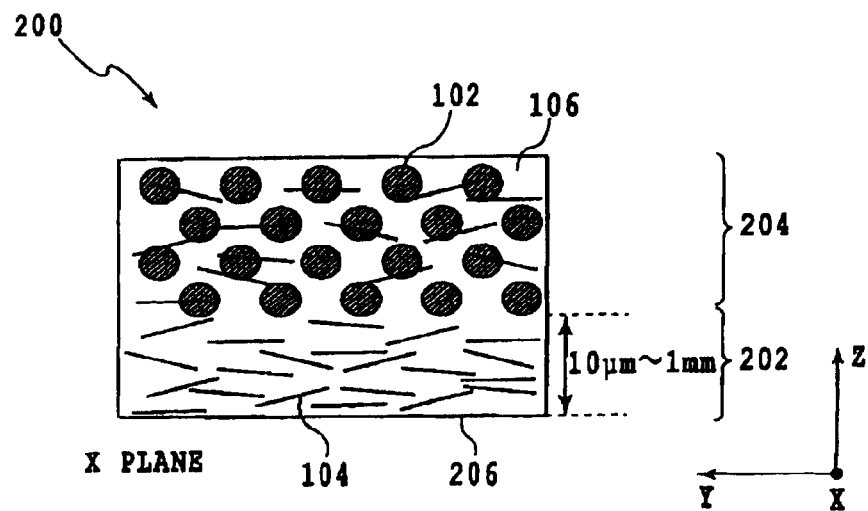
FIG. 2A is a schematic diagram showing the structure of a metal-based carbon fiber composite material in another embodiment of the present invention.
Figure 2B:
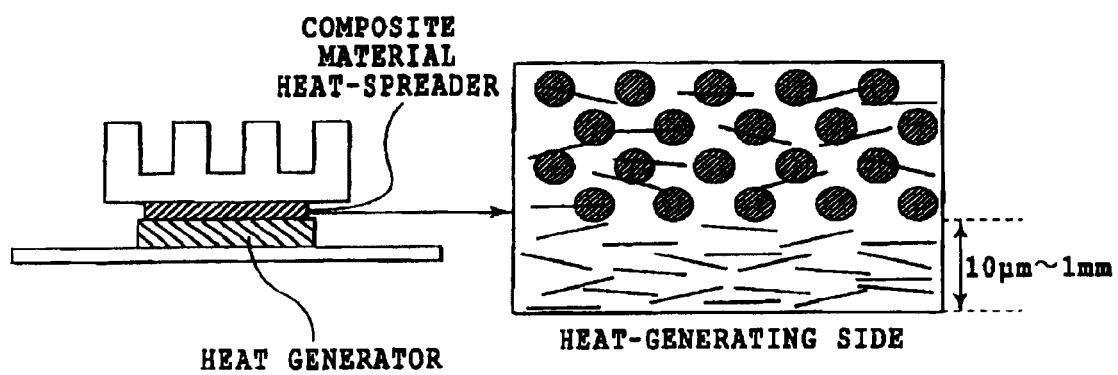
FIG. 2B is a schematic diagram showing an example of an application of the composite material shown in FIG. 1A to a heat generator.

A metal-based carbon fiber composite material according to the second embodiment of the present invention is next described, referring to FIGS. 2A and 2B. FIG. 2A is a schematic diagram showing the structure of a metal-based carbon fiber composite material according to the second embodiment of the present invention when viewed from the X plane, using the same coordinate axes as shown in FIGS. 1A to 1C. FIG. 2B is a diagram showing the state in which the metal-based carbon fiber composite material is mounted on a heat generator.

As shown in FIG. 2A, a metal-based carbon fiber composite material 200 according to the second embodiment is characterized in that it comprises, in a surface region 202 thereof, a smaller amount of a micron-size carbon fiber 102 than that in the other region 204, or is free of the micron-size carbon fiber; and a nano-size carbon fiber 104 has an orientation parallel to a surface 206 of the composite material. FIG. 2A illustrates an example of the composite material not containing the micron-size carbon fiber in its surface region.

The composite material according to the second embodiment is thus characterized in that it comprises an inner region thereof at a certain distance from a first surface (for example, the surface 206 parallel to the X-Y plane shown in FIG. 2A). The inner region comprises a smaller amount of the micron-size carbon fiber than that in the other region, or is free of the micron-size carbon fiber; and the nano-size carbon fiber has an orientation substantially parallel to the first surface of the composite material. Preferably, at least 90% of the nano-size carbon fiber in the inner region at a certain distance from the first surface has an orientation substantially parallel to the first surface.

In the present invention, the certain distance from the first surface is preferably from 10 μm to 5 mm from the first surface (for example, the surface 206 parallel to the X-Y plane shown in FIG. 2A).

In the composite material according to the second embodiment of the present invention, the surface region 202 comprises a small amount of the micron-size carbon fiber or is free of the micron-size carbon fiber, and the nano-size carbon fiber is oriented along the surface 206. Because of this structure, the composite material can exhibit an isotropic thermal expansion coefficient inside the surfaces thereof. Since thermal expansion is considerably suppressed in the direction of the orientation of the micron-size carbon fiber, it is possible to control the surfaces of the composite material according to the thermal expansion coefficient of the heat-generating device, using the structure of the composite material according to the second embodiment. That is to say, by suitably selecting the amount of the carbon fibers in the surface region, it is possible to control the surfaces of the composite material according to the thermal expansion coefficient of the heat-generating device.

Note that the composite material according to the second embodiment of the present invention can be composed of, not only two layers as described above, but also multiple layers. For example, the other region 204 can be composed of a plurality of layers. In this case, the composition of the material forming each layer, which is a metal, a micron-size carbon fiber, or a nano-size carbon fiber, is different from one another, including that in the surface region 202. This enables further improvements in the thermal conductivity and thermal expansion coefficient.

The metal-based carbon fiber composite material of the present invention has a thermal conductivity of 300 to 1000 W/(mK) (kelvin per watt per meter) in the direction of the orientation of the micron-size carbon fiber (for example, along the X-axis in FIG. 1A) (one direction). Because the nano-size carbon fiber contributes to thermal conductivity, the composite material also has a thermal conductivity of 50 to 200 W/(mK) in the direction perpendicular to the micron-size carbon fiber (for example, along the Z-axis in FIG. 1A). The composite material has a thermal expansion coefficient of −1 to 20 ppm/K, due to the effect of the micron-size carbon fiber and the nano-size carbon fiber that is oriented randomly in the plane perpendicular to the micron-size carbon fiber (the X-Y plane shown in FIG. 1A above). These values can be controlled by suitably selecting the combination rate of the micron-size carbon fiber and the combination rate of the nano-size carbon fiber, as well as the directions of their orientations.

Each component of the metal-based carbon fiber composite material of the present invention is next described.

1. Carbon Fibers

Examples of micron-size carbon fibers for use in the present invention include pitch-based carbon fibers, PAN-based carbon fibers, and vapor-grown carbon fibers. Fibers with diameters of 1 μm to 50 μm are suitable as these carbon fibers. While depending on the dimensions of a desired composite material, these carbon fibers preferably have lengths of 1 mm or more, and particularly preferably have the same length as the length of from one end to the other end of the desired composite material. In the present invention, the micron-size carbon fiber is oriented in one direction in the composite material, and preferably, at least 50% of the micron-size carbon fiber based on the total amount thereof is continuous from one end to the other end in the direction of its orientation in the composite material.

Examples of nano-size carbon fibers include vapor-grown carbon fibers, multiwalled carbon nanotubes (MWCNT), and single-walled carbon nanotubes (SWCNT). Fibers with lengths of 1 μm (1000 nm) or less are suitable as these carbon fibers and carbon nanotubes. The nano-size carbon fiber preferably has an aspect ratio (length/diameter) of at least 10 or more.

2. Metal

The metal for use in the present invention is a metal with a high thermal conductivity, and examples include aluminum, aluminum alloys, copper, copper alloys, magnesium, and magnesium alloys. For example, when the primary object is to increase the thermal conductivity, copper or an alloy thereof can be used. When, for example, the primary object is to decrease the weight, aluminum, an aluminum alloy, magnesium, or a magnesium alloy with a lower density can be used. In terms of metal density, aluminum (2.7 g/cm$^3$), magnesium (1.8 g/cm$^3$), and copper (8.9 g/cm$^3$), as well as alloys principally containing these metals are preferable. Using any of these materials, the density of the composite material of the present invention can be reduced (reduction in weight).

The metal is preferably a powder with an average particle size of 10 nm to 50 μm.

By combining a metal and two types of carbon fibers, it is possible to obtain an aluminum-based carbon fiber composite material (2.6 g/cm$^3$ or less), a magnesium-based carbon fiber composite material (2.2 g/cm$^3$ or less), or a copper-based carbon fiber composite material (7.6 g/cm$^3$ or less). Such a composite material preferably has a total carbon content, which is the total amount of the micron-size carbon fiber and the nano-size carbon fiber, of 20 to 80% by volume of the composite material.

Table 1 below shows the thermal properties of a typical carbon fiber and metals.

TABLE 1

Values of physical properties of raw materials

| Materials | | Thermal conductivity (W/(mK)) | Thermal expansion coefficient (ppm/K) | Density (g/cm$^3$) |
|---|---|---|---|---|
| Graphite | c-axis | 1950 | −15 | 2.2 |
| | a-axis | 20 or less | 2.8 | |
| Aluminum | | 238 | 23 | 2.7 |
| Magnesium | | 156 | 26 | 1.8 |
| Copper | | 398 | 17 | 8.9 |

The metal-based carbon fiber composite material of the present invention is useful as, for example, a heat-dissipating member (such as a substrate, heatsink, heat-spreader, or the like) of electronic devices using semiconductors or power modules. Electronic devices using semiconductors may be any known in the art, such as, for example, central processing units (CPUs), storage cells (memory), controller ICs of various devices, flat panel display devices, image processing devices, communication devices (wireless and cable), photo-electric hybrid circuits, etc. Examples of power modules include converters, inverters and the like using elements such as thyristors, GTOs, IGBTs, and IEGTs, etc. When used as a heat-dissipating member such as a heatsink or heat spreader, the metal-based carbon fiber composite material of the present invention is worked into a suitable shape, and mounted so as to transfer the heat generated by these devices to an intermediate or final refrigerant. In particular, in the case of a multilayer metal-based carbon fiber composite material as shown in FIG. 2A, it is preferably mounted so that the surface region 202 comes into contact with a heat generator (see FIG. 2B).

In addition, when the metal-based carbon fiber composite material is brought into contact with a heat generator, a flexible thermal conductive medium (such as for example, a silicone grease, a thermal conductive sheet or the like, in which high thermal conductive particles such as silver may be dispersed) may be used to fill the irregularities of the joint region between the surfaces of the composite material of the present invention and the device, so as to achieve uniform heat transfer from the device to the composite material.

The method for producing the metal-based carbon fiber composite material of the present invention will next be described.

One embodiment of the method according to the present invention comprises the steps of (a) mixing a metal powder and a nano-size carbon fiber to prepare a mixture of the metal powder and the nano-size carbon fiber; (b) causing the mixture of the metal powder and the nano-size carbon fiber to adhere to a micron-size carbon fiber to prepare a fiber adhered with the metal powder and the nano-size carbon fiber; (c) charging the fiber adhered with the metal powder and the nano-size carbon fiber into a jig while orienting the fiber; and (d) heating the jig to sinter the charged material.

In another embodiment, the method comprises the steps of (A) mixing a metal powder and a nano-size carbon fiber to prepare a mixture of the metal powder and the nano-size carbon fiber; (B) causing the mixture of the metal powder and the nano-size carbon fiber to adhere to a micron-size carbon fiber to prepare a fiber adhered with the metal powder and the nano-size carbon fiber; (C) charging the mixture of the metal powder and the nano-size carbon fiber or the fiber adhered with the metal powder and the nano-size carbon fiber into a jig while orienting the mixture or the fiber; heating the jig to sinter the charged material; and obtaining a sintered mixture of metal and nano-size carbon fiber or a sintered fiber adhered with the metal and the nano-size carbon fiber; (D) charging stepwise into a jig two or more materials selected from the mixture of the metal powder and the nano-size carbon fiber, the fiber adhered with the metal powder and the nano-size carbon fiber, the sintered mixture of metal and nano-size carbon fiber, and the sintered fiber adhered with metal and nano-size carbon fiber, to obtain a charged material having a plurality of layers; and (E) heating the jig to sinter the charged material.

The production method of the present invention will hereinafter be described in detail below, with reference to the drawings.

The first step of the method of the present invention is a step of mixing a metal powder and a nano-size carbon fiber to prepare a mixture of the metal powder and the nano-size carbon fiber.

A metal powder and a nano-size carbon fiber are mixed together. Since both the nano-size carbon fiber and the metal powder are liable to aggregate, they are desirably mixed by a wet mixing method. When aluminum, magnesium, or an alloy based on aluminum or magnesium is used, an organic solvent can be used as a solvent for the mixed liquid. When copper or an alloy based on copper is used, water can also be used as a solvent. An organic solvent can be selected from alcohols (such as methanol, ethanol, and propanol); hydrocarbon solvents (such as, for example, hexane, benzene, xylene, and toluene); ketones (such as acetone); ethers (such as dimethyl ether, diethyl ether, ethylmethyl ether); halogenated hydrocarbons (such as chloroform); mineral spirits; and the like; although the solvent is not limited to these examples. As necessary, a dispersant is preferably added in an amount of 0.1 to 2 wt % based on the solvent. Examples of dispersants include polyethylene glycol, Pluronic-type dispersants (Pluronic® F68), and the like.

A solvent is added in an amount of about 50 to 90% by volume of the solids content (the metal powder and nano-size carbon fiber). The solvent, metal, and nano-size carbon fiber are mixed using any of a stirrer, an ultrasonic mixer, and a ball mill, or a combination thereof. For example, mixing with a stirrer and ultrasonic mixer can be performed simultaneously. These mixing conditions may be selected suitably according to the materials, and can be easily selected by a person skilled in the art.

The second step is a step of causing the mixture of the metal powder and the nano-size carbon fiber to adhere to a micron-size carbon fiber to prepare a fiber adhered with the metal powder and the nano-size carbon fiber.

Figure 3:
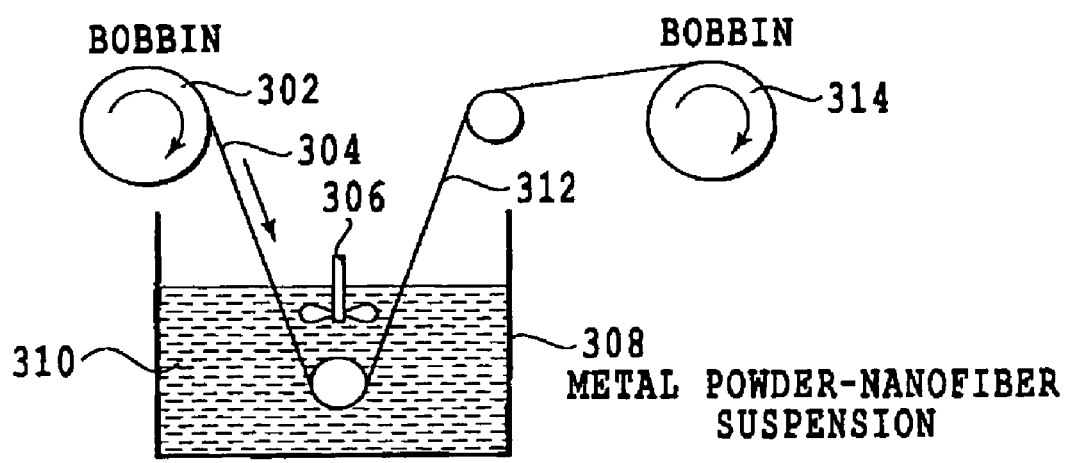
FIG. 3 is a diagram for explaining the step of producing a fiber adhered with the metal powder and the nano-size carbon fiber for use in the present invention.

The suspension of the mixture of the metal powder and the nano-size carbon fiber prepared in the first step is adhered to a micron-size carbon fiber. Adhesion is accomplished by immersing the micron-size carbon fiber in the suspension. Commercial micron carbon fibers are composed of 2000 to 20000 bundles wound around a bobbin; therefore, as shown in FIG. 3, the suspension can be adhered to the micron carbon fiber continuously by immersing the carbon fiber in the suspension via a roller. The immersion speed may, for example, be from 10 to 200 mm/s. This immersion step may be performed either automatically or manually.

With the apparatus shown in FIG. 3, fiber bundles 304 are unwound from an unwinding bobbin 302 and immersed in a mixture of the metal powder and the nano-size carbon fiber (metal powder suspension) 310 in a vessel 30B stirred by a stirrer 306, and a fiber adhered with the metal powder and the nano-size carbon fiber (fiber bundles adhered with the metal powder) 312 are wound onto a winding bobbin 314.

The fiber adhered with the metal powder and the nano-size carbon fiber is subsequently dried. Prior to or after winding the fiber bundles onto the winding bobbin 314, a process such as air-drying, drying with a hot-air (heat) dryer, vacuum-drying at ordinary temperature with a rotary pump, or the like can be applied. The drying conditions may be selected suitably according to the materials, and can be easily selected by a person skilled in the art.

Since the mixture of the metal powder and the nano-size carbon fiber is fine, even after drying, it is hardly separated due to naturally produced electrostatic force. When separation is problematic, a binder such as a paraffin wax or the like is mixed in an amount of 0.1 to 2 wt % in the metal powder suspension solvent, so as to maintain the mixture of the metal powder and nano-size carbon fiber onto the micron-size carbon fiber. In this case, it is necessary to perform a step of dewaxing in an inert atmosphere at a temperature of 500° C. or higher. Therefore, when a metal with a low melting point such as aluminum, magnesium or the like is used, a separate process (for example, a process as explained below) will be necessary.

Subsequently, the third step of the present invention is a step of charging the fiber adhered with the metal powder and the nano-size carbon fiber into a jig while orienting the fiber. The fourth step of the present invention is a step of sintering the material charged in the third step. In the present invention, a uniaxial pressure sintering method can be used. As an example of a method of high productivity, a pulsed electric current sintering method can be mentioned. In addition to these, a hot-press method can also be applied. The third step and the fourth step together will hereinafter be described.

Figure 4A:
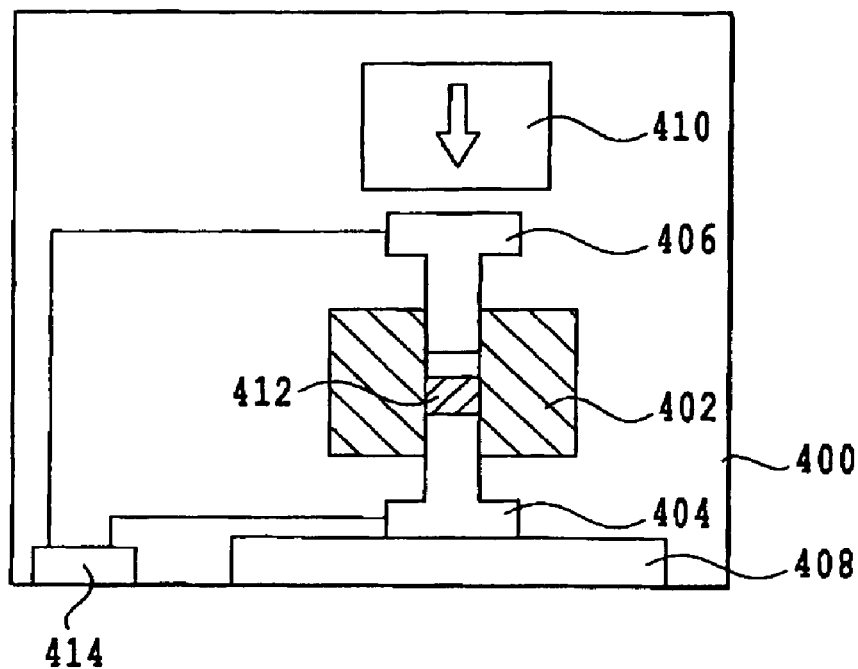
FIG. 4A is a diagram showing an example of an apparatus for use in producing a metal-based carbon fiber composite material of the present invention.
Figure 4B:
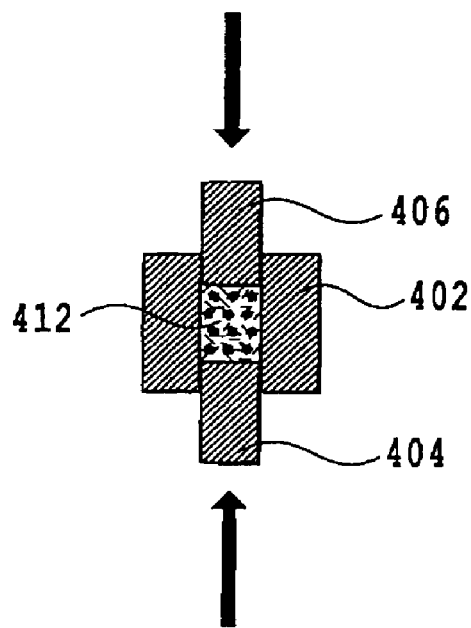
FIG. 4B is a schematic enlarged view of a portion including a die, a lower portion, and an upper punch.

FIGS. 4A and 4B show a pressure sintering apparatus that can be used in the present invention. FIG. 4A is a schematic diagram showing the general structure of the apparatus; and FIG. 4B is an enlarged view of a portion including a die, a lower punch, and an upper punch (the jig portion). The pressure sintering apparatus shown in FIG. 4A comprises a pressure sintering vessel 400; a jig composed of a die 402 with a through hole, as well as a lower punch 404 and an upper punch 406 that fit into the through hole; a platen 408 and a plunger 410 for applying pressure to the lower punch 404 and the upper punch 406; and a power supply source 414 connected to the lower punch 404 and the upper punch 406 to pass a current through a material 412.

First, the fiber adhered with the metal powder and the nano-size carbon fiber is cut to a predetermined length, and charged into the jig of the pressure sintering apparatus.

As shown in FIG. 4B, the material 412 is charged into the recess portion formed upon fitting the lower punch 404 into the die 402, while orienting the fiber. For example, when the fiber adhered with the metal powder and the nano-size carbon fiber obtained by the above-described suspension immersion method is used, the carbon fiber unwound from the winding bobbin can be cut to a suitable length, and the cut fiber adhered with the metal powder and the nano-size carbon fiber can be charged into the recess portion defined by the die 402 and lower punch 404 while orienting the fiber. Moreover, when a dispersant is used in the metal powder suspension, a fiber adhered with the metal powder and the nano-size carbon fiber comprising a metal powder and a carbon fiber is preferably formed by, prior to or after mounting the upper punch 406, removing the dispersant by heating the charged fiber adhered with the metal powder and the nano-size carbon fiber to a temperature of 200 to 400° C. in vacuum or an inert atmosphere (nitrogen, argon, helium, or the like) at a reduced pressure of 1 to 10 MPa. The step of removing the dispersant by heating may be performed in a pulsed electric current sintering apparatus additionally provided with heating means, or in a separated heating apparatus. When a copper powder is used as a metal powder, the step of removing the dispersant by heating may be performed in an oxidizing atmosphere (air, oxygen-enriched air, pure oxygen, or the like).

The upper punch 406 is then mounted on the charged material (the fiber adhered with the metal powder and the nano-size carbon fiber) 412, and the combined jig is disposed between the platen 408 and the plunger 410 of the press in the pressure sintering vessel 400 to perform the sintering step. The sintering step is preferably performed in air, vacuum, or an inert atmosphere. In order to place the pressure sintering vessel 400 in vacuum, the pressure sintering vessel 400 may have an air outlet (not shown) connected to a suitable evacuation system. When the sintering step is performed in vacuum, the pressure inside the vessel is from 0 to 20 Pa, and preferably 0 to 5 Pa. Alternatively, the pressure sintering vessel 400 may have an inert gas inlet and a gas outlet (neither shown), and the pressure sintering vessel 400 may be purged with an inert gas (nitrogen, argon, helium, or the like) to achieve an inert atmosphere.

The upper punch 406 is subsequently pressed with the plunger to apply pressure to the material (the fiber adhered with the metal powder and the nano-size carbon fiber) 412. The applied pressure is preferably from 5 to 300 MPa, for example. Although the sintering temperature depends on the type of the metal, in the case of pure aluminum or pure magnesium, the sintering temperature may, for example, be from 500 to 650° C.; and in the case of pure copper, the sintering temperature may be from about 700 to 1050° C. The sintering atmosphere is preferably a vacuum of 50 Pa or less, or an inert atmosphere, such as nitrogen, argon, or the like, of 0.1 MPa (1 atm) or less.

Then, using the power supply source 414 connected to the lower punch 404 and the upper punch 406, a pulsed current is passed through the material 412 to perform sintering. The pulse width of the current used at this time is from 0.005 to 0.02 seconds, and preferably 0.005 to 0.01 seconds, and the current density (based on the cross-sectional area of the through hole of the die 402) is from $5 \times 10^5$ to $2 \times 10^7$ A/m$^2$, and preferably $5 \times 10^6$ to $1 \times 10^7$ A/m$^2$. The voltage required to achieve such a current density is usually in the range of 2 to 8 V, although it depends on the resistance of the current conduction passage including the material 412. The passage of a pulsed current is continued until desired sintering is accomplished, and the duration of time changes depending on the dimensions of the composite material, the current density, the mixture ratio of the carbon fibers, etc.

As described above, the passage of a pulsed current causes plastic deformation of the metal particles and fusion among powder particles to allow sintering to proceed. When a pulsed current is used as in this step, unlike in the case of heating the entire metal-fiber mixture, heat is concentrated on the region where bonding between metal particles should occur. This enables more effective use of current energy and more rapid sintering. The use of a pulsed current is also advantageous to conventional molten bath impregnation methods in that the temperature of the entire metal-fiber mixture does not significantly increase to prevent the formation of a carbide due to the reaction between a metal and a carbon fiber. Therefore, it is possible to obtain a metal-based carbon fiber composite material with excellent properties, using inexpensive carbon fibers without coatings or the like. Moreover, this method is also advantageous to typical resistance-heating in that plasma generated at the initial stage of passing current acts to remove the adsorption gas and the oxide coating film on the powder.

Figure 5:
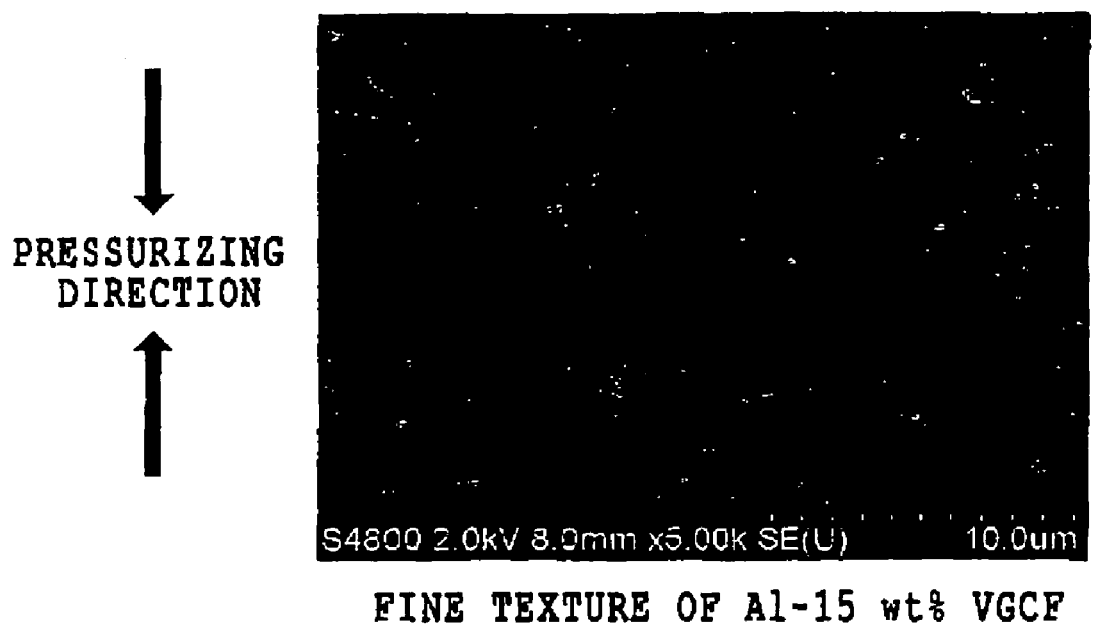
FIG. 5 shows an electron micrograph of an Al-15 wt % VGCF composite material prepared using a pulsed electric current sintering method.

Through such a uniaxial pressing process, at least 80% of the nano-size carbon fiber falls toward the plane perpendicular to the pressurizing axis, so as to be oriented at an angle within 30°, and preferably within 10°, with respect to the plane (for example, the X-Y plane shown in FIG. 1A) perpendicular to the pressurizing axis (for example, the Z-axis shown in FIG. 1A). FIG. 5 shows an electron micrograph of a composite material obtained using a pulsed electric current sintering method, using Al-15 wt % VGCF (which corresponds to the surface layer portion of a composite material as shown in FIG. 2A above, in which the surface region thereof is substantially free of a micron-size carbon fiber). In the composite material, VGCF (a nano-size carbon fiber) is oriented along the plane perpendicular to the pressurizing axis (that is, in the lateral direction of the paper of FIG. 5).

Another embodiment of the production method of the present invention is described with reference to FIGS. 6A to 6D. In this embodiment, materials of different compositions are charged in multiple stages when charging materials onto the lower punch 404 of the die 402. According to this embodiment, it is possible to produce a metal-based carbon fiber composite material having a surface portion substantially free of a micron-size carbon fiber, as shown in FIG. 2A.

Figure 6A:
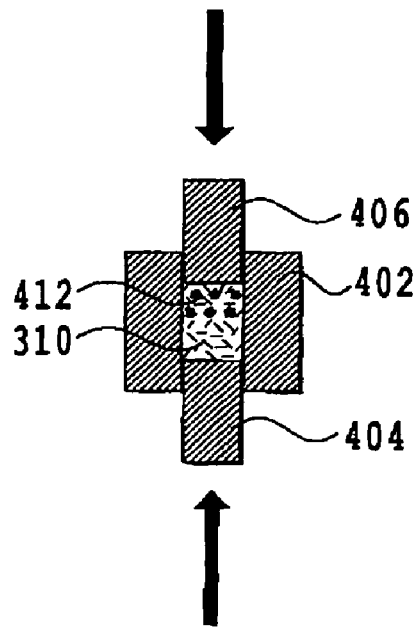
FIG. 6A is a diagram for explaining how to charge a mixture of the metal powder and the nano-size carbon fiber and the like in producing a metal-based carbon fiber composite material of the present invention.

In a first example of this embodiment, as shown in FIG. 6A, materials of different unsintered metal-based carbon fiber composite materials are charged in two stages, and subjected to pressure sintering. Examples of different raw materials include a mixture of the metal powder and the nano-size carbon fiber and a fiber adhered with the metal powder and the nano-size carbon fiber. Charging may be performed by, for example, charging the mixture of the metal powder and the nano-size carbon fiber first, followed by the fiber adhered with the metal powder and the nano-size carbon fiber, or may be performed in the opposite order.

Figure 6B:
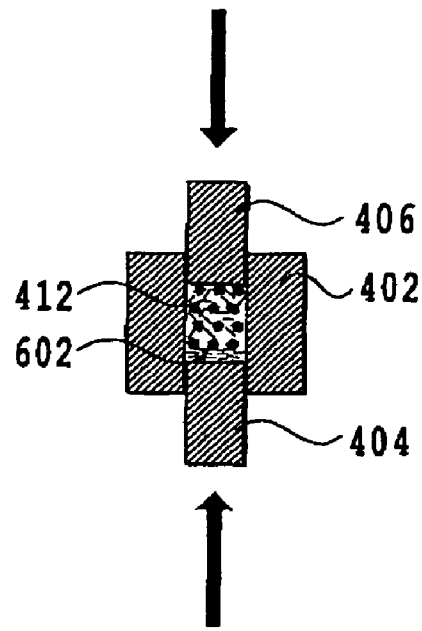
FIG. 6B is a diagram for explaining how to charge a mixture of the metal powder and the nano-size carbon fiber and the like in producing a metal-based carbon fiber composite material of the present invention.
Figure 6C:
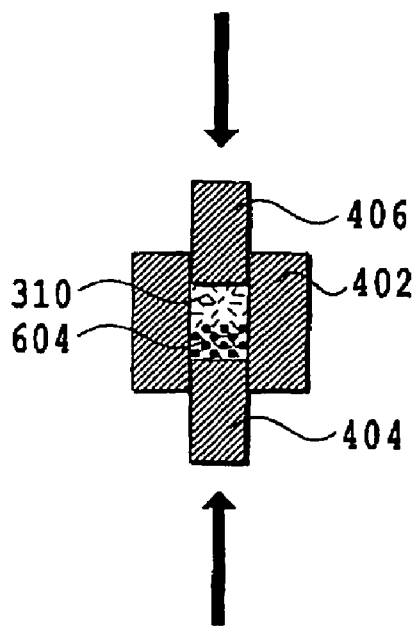
FIG. 6C is a diagram for explaining how to charge a mixture of the metal powder and the nano-size carbon fiber and the like in producing a metal-based carbon fiber composite material of the present invention.

In other methods (second and third examples), a combination of raw materials of a pre-sintered metal-based carbon fiber composite material and an unsintered metal-based carbon fiber composite material can be charged. For example, as shown in FIG. 6B, a sintered mixture of the metal powder and the nano-size carbon fiber 602 may be charged first, followed by a fiber adhered with the metal powder and the nano-size carbon fiber 312. The opposite order is also possible (see FIG. 6C).

Figure 6D:
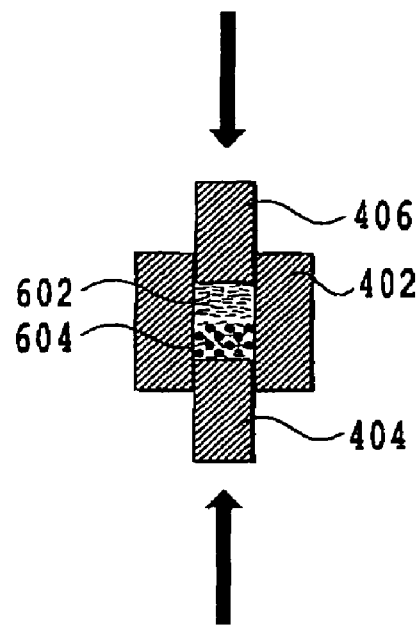
FIG. 6D is a diagram for explaining how to charge a mixture of the metal powder and the nano-size carbon fiber and the like in producing a metal-based carbon fiber composite material of the present invention.

In a further method (a fourth example), different sintered metal-based carbon fiber composite materials may be charged again and bonded by sintering. For example, as shown in FIG. 6D, a pre-sintered fiber adhered with metal and nano-size carbon fiber 604 and a pre-sintered mixture of metal and nano-size carbon fiber 602 are charged in a desired order (in the figure, the sintered fiber adhered with metal and nano-size carbon fiber precedes the pre-sintered mixture of metal and nano-size carbon fiber; but the layers can also be formed in the opposite order), and bonded by sintering.

Although the example is one in which a metal-based carbon fiber composite material with two layers is produced, in this embodiment, a metal-based carbon fiber composite material with more layers can also be produced for the purpose of alleviating thermal strain, etc. In order to produce such a metal-based carbon fiber composite material with more than two layers, different materials may be charged in multiple stages and sintered, using any of the aforementioned methods.

According to this embodiment, a plurality of layers composed of materials with different compositions (the mixture ratio, structure, etc.) can be prepared.

EXAMPLE 1

An example of a composite material containing aluminum, a vapor-grown carbon nanofiber, and a pitch-based carbon fiber is described.

An aluminum powder (manufactured by Showa Denko; average particle size: 5 μm), a vapor-grown carbon nanofiber (hereinafter "VGCF", manufactured by Showa Denko; diameter: 150 nm; aspect ratio: 60 or more), and a pitch-based carbon fiber (diameter: 10 μm; 2000 fiber bundles) were used.

80 cc of isopropanol was added to 47.5 g of the aluminum powder and 2.5 g of VGCF and mixed for 1 hour using an ultrasonic mixer to yield an aluminum-nanofiber mixture.

Fiber bundles of the pitch-based carbon fiber were immersed in the thus-obtained suspension to allow the aluminum-nanofiber mixture to adhere to the fiber bundles.

The resulting material was air-dried for 24 hours. As a result, a fiber adhered with the metal powder and the nano-size carbon fiber containing 33.3 wt % of the aluminum powder, 1.7 wt % of VGCF, and 65 wt % of the pitch-based carbon fiber was obtained.

The fiber adhered with the metal powder and the nano-size carbon fiber was cut to 20 mm and charged into a graphite sintering die with a 20×20 mm square cross-section. The die was sintered using a pulsed electric current sintering apparatus in a vacuum of 10 Pa, at a pressure of 50 MPa and a sintering temperature of 600° C., to yield a composite material. Table 2 shows the thermal properties of the resulting composite material along with the thermal properties of the composite material of aluminum and pitch-based carbon fiber. In Table 2, X, Y and Z show the directions when the composite materials are disposed using the X, Y and Z axes.

TABLE 2

Thermal properties of composite materials

| | | Composite material of aluminum, VGCF and pitch-based carbon fiber | Composite material of aluminum and pitch-based carbon fiber |
|---|---|---|---|
| Pitch-based carbon fiber (vol %) | | 69 | 65 |
| VGCF (vol %) | | 1.9 | 0 |
| Thermal conductivity (W/(mK)) | | | |
| | X | 749 | 630 |
| | Y | 37 | 30 |
| | Z | 8 | 8 |
| Thermal expansion coefficient (ppm/K) | | | |
| RT to 100° C. | X | −0.2 | −1.2 |
| | Y | 16 | 20.2 |
| | Z | 20 | 19.0 |

Figure 7:
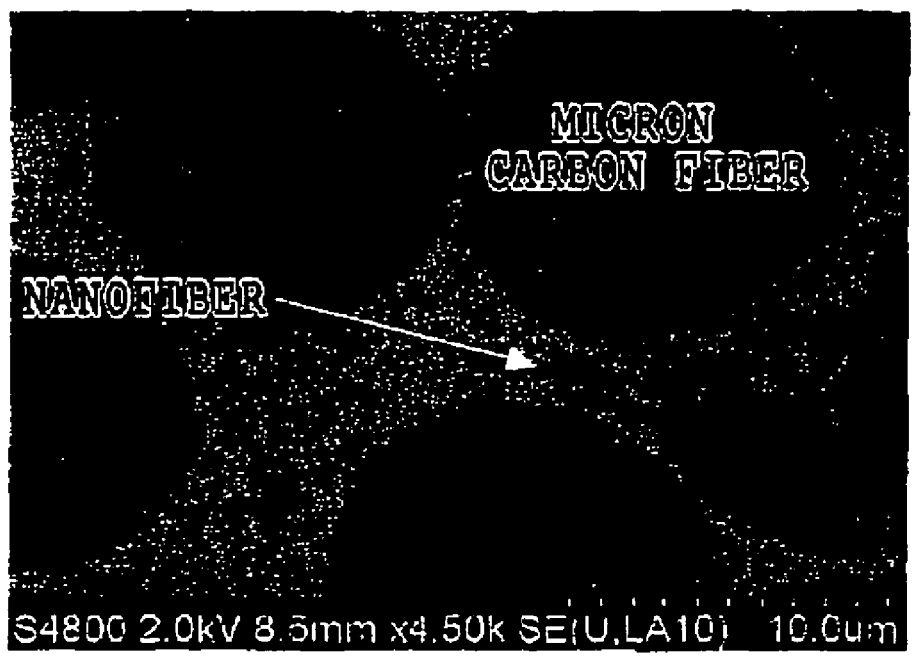
FIG. 7 is an electron micrograph of a composite material containing aluminum, a vapor-grown carbon nanofiber, and a pitch-based carbon fiber prepared in an example.
Figure 8A:
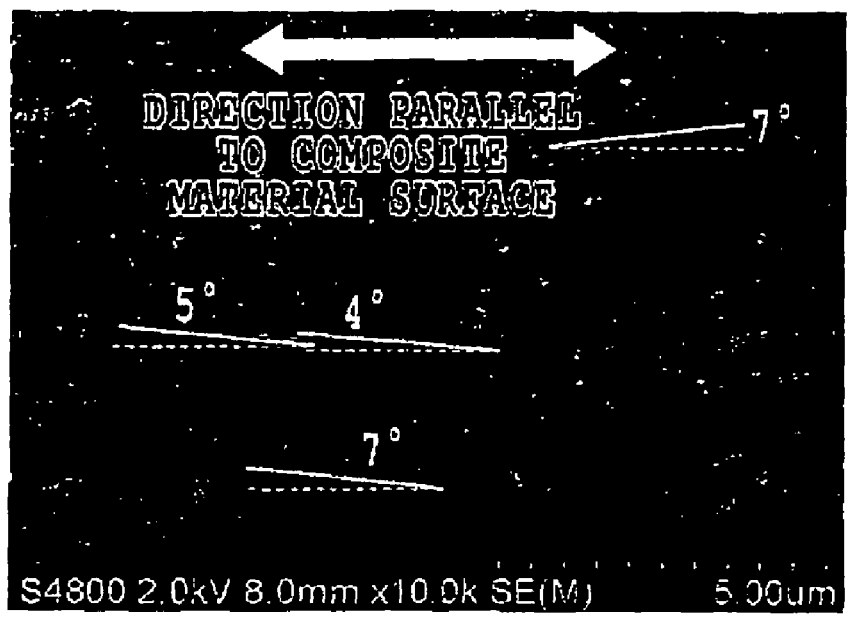
FIG. 8A is an electron micrograph of a carbon fiber composite material of the present invention prepared according to Example 2, showing the orientation of the nano-size carbon fiber with respect to a surface of the composite material.
Figure 8B:
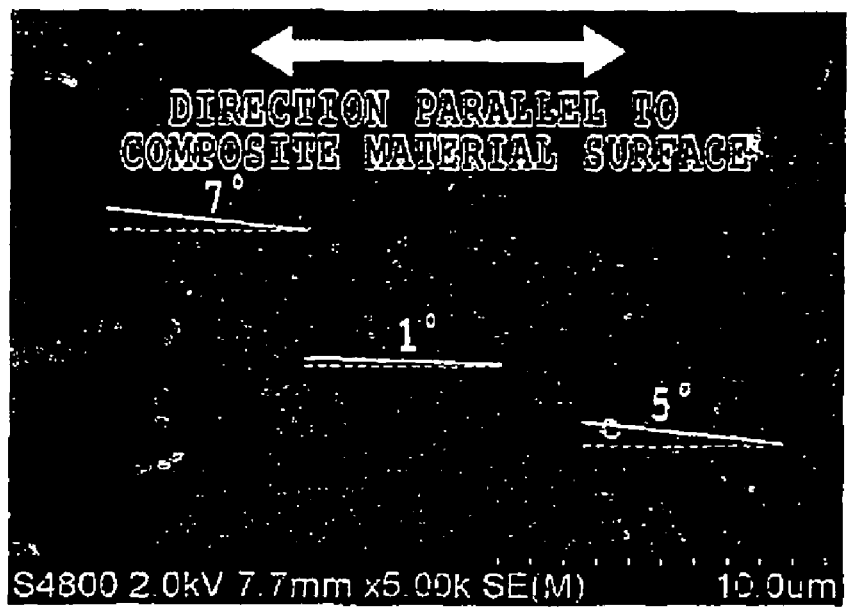
FIG. 8B is an electron micrograph of a carbon fiber composite material of the present invention prepared according to Example 1, showing the orientation of the nano-size carbon fiber with respect to a surface of the composite material.

FIG. 7 and FIG. 8B show electron micrographs of the resulting composite material. As shown in FIG. 8B, it is seen that 80% of the nanofiber is oriented within a certain range, i.e., at an angle within 30°, and preferably 10°, with respect to a surface of the composite material (in FIG. 1A, the X-Y plane as the first surface of the composite material) (FIG. 8B shows only the angles of the portions oriented at angles within 10°). In addition, as is clear from FIG. 7 and FIG. 8B, at least 50% of the micron-size carbon fiber is continuous from one end of the first surface of the composite material to the opposite other end (in FIG. 1A, from the surface 110 to the surface 112 parallel to the Y-Z plane of the composite material).

EXAMPLE 2

An example of a composite material containing aluminum and a vapor-grown carbon nanofiber is described.

An aluminum powder (manufactured by Showa Denko; average particle size: 5 μm), a vapor-grown carbon nanofiber (hereinafter "VGCF", manufactured by Showa Denko; diameter: 150 nm; aspect ratio: 60 or more), and a pitch-based carbon fiber (diameter: 10 μm; 2000 fiber bundles) were used.

80 cc of isopropanol was added to 42.5 g of the aluminum powder and 7.5 g of VGCF and mixed for 1 hour using an ultrasonic mixer.

The resulting material was air-dried for 24 hours. As a result, a mixed powder containing 75 wt % of the aluminum powder and 15 wt % of VGCF was obtained.

The resulting mixed powder was charged into a graphite sintering die with a 20×20 mm square cross-section. The die was sintered using a pulsed electric current sintering apparatus in a vacuum of 10 Pa, at a pressure of 50 MPa and a sintering temperature of 600° C., to yield a composite material. Table 3 shows the thermal properties of the resulting composite material. FIG. 5 and FIG. 8A show electron micrographs of the resulting composite material. As shown in FIG. 8A, it is seen that 80% of the nanofiber is oriented within a certain range, i.e., at an angle within 30°, and preferably 10°, with respect to a surface of the composite material (in FIG. 1A, the X-Y plane as the first surface of the composite material) (FIG. 8A shows only the angles of the portions oriented at angles within 10°).

TABLE 3

Thermal properties of composite materials

|  |  | Composite material of aluminum and VGCF |
|---|---|---|
| VGCF (vol %) |  | 15 |
| Thermal conductivity (W/(mK)) |  |  |
|  | X | 112 |
|  | Y | 112 |
|  | Z | 67 |
| Thermal expansion coefficient (ppm/K) |  |  |
| RT to 100° C. | X | 15.8 |
|  | Y | 15.8 |
|  | Z | — |

EXAMPLE 3

The composite materials obtained in the aforementioned Examples 1 and 2 were charged into a graphite sintering die with a 20×20 mm square cross-section. The die was sintered using a pulsed electric current sintering apparatus in a vacuum of 10 Pa, at a pressure of 50 MPa and a sintering temperature of 600° C., to yield a composite material having a surface region that is free of the micron-size carbon fiber. The resulting composite material was a composite material with layers that exhibit the properties obtained according to Examples 1 and 2, respectively.

The invention claimed is:

1. A metal-based carbon fiber composite material, comprising a metal; and a carbon fiber comprising a micron-size carbon fiber and a nano-size carbon fiber, wherein
   the composite material has a first surface;
   the micron-size carbon fiber is charged so as to be oriented in one direction parallel to the first surface of the composite material;
   at least 50% of the micron-size carbon fiber is continuous from one end of the first surface to an opposite other end;
   80% of the nano-size carbon fiber is oriented at an angle within 30° with respect to the first surface;
   the nano-size carbon fiber is oriented randomly in a plane parallel to the first surface; and
   wherein the composite material comprises an inner region thereof at a certain distance from the first surface, the inner region comprising a smaller amount of the micron-size carbon fiber than that in another region, or being free of the micron-size carbon fiber; and
   the nano-size carbon fiber has an orientation parallel to the first surface of the composite material.

2. The metal-based carbon fiber composite material according to claim 1, wherein
   the another region comprises a plurality of layers; and
   the composition of each layer of a metal, a micron-size carbon fiber, or a nano-size carbon fiber is different from one another.

3. The metal-based carbon fiber composite material according to claim 1, wherein the certain distance from the first surface is from 10 μm to 5 mm from the surface.

4. The metal-based carbon fiber composite material according to claim 1, wherein the composite material comprises 20 to 80% by volume of the micron-size carbon fiber and 1 to 50% by volume of the nano-size carbon fiber.

5. The metal-based carbon fiber composite material according to claim 1, wherein the micron-size carbon fiber is selected from a pitch-based carbon fiber, a PAN-based carbon fiber, and a vapor-grown carbon fiber; and the nano-size carbon fiber is selected from a vapor-grown carbon fiber, a multiwalled carbon nanotube, and a single-walled carbon nanotube.

6. The metal-based carbon fiber composite material according to claim 1, wherein the metal is selected from the group consisting of copper, aluminum, magnesium, and alloys based on these metals.

7. A method for producing a metal-based carbon fiber composite material according to claim 1, comprising the steps of:
   (A) mixing a metal powder and a nano-size carbon fiber to prepare a mixture of the metal powder and the nano-size carbon fiber;
   (B) causing the mixture of the metal powder and the nano-size carbon fiber to adhere to a micron-size carbon fiber to prepare a fiber adhered with the metal powder and the nano-size carbon fiber;
   (C) charging the mixture of the metal powder and the nano-size carbon fiber or the fiber adhered with the metal powder and the nano-size carbon fiber into a jig while orienting the mixture or the fiber; heating the jig to sinter the charged material; and obtaining a sintered mixture of metal and nano-size carbon fiber or a sintered fiber adhered with the metal and the nano-size carbon fiber;
   (D) charging stepwise into a jig two or more materials selected from the mixture of the metal powder and the nano-size carbon fiber, the fiber adhered with the metal powder and the nano-size carbon fiber, the sintered mixture of metal and nano-size carbon fiber, and the sintered fiber adhered with metal and nano-size carbon fiber, to obtain a charged material having a plurality of layers; and (E) heating the jig to sinter the charged material wherein in step (D), two materials from the mixture of the metal powder and the nano-size carbon fiber or the sintered mixture of metal and nano-size carbon fiber and the fiber adhered with the metal powder and the nano-size carbon fiber or the sintered fiber adhered with metal and nano-size carbon fiber are charged stepwise into a jig to produce a metal-based carbon fiber composite material;

whereby to obtain the composite material in which the composite material comprises an inner region thereof at a certain distance from the first surface, the inner region comprising a smaller amount of the micron-size carbon fiber than that in another region, or being free of the micron-size carbon fiber, and the nano-size carbon fiber has an orientation parallel to the first surface of the composite material.

8. The method according to claim 7, wherein
the certain distance from the first surface is 10 μm to 5 mm from the surface.

9. The method according to claim 7, wherein the micro-size carbon fiber is selected from a pitch-based carbon fiber, a PAN-based carbon fiber, and a vapor-grown carbon fiber; and the nano-size carbon fiber is selected from a vapor-grown carbon fiber, a multiwalled carbon nanotube, and a single-walled carbon nanotube.

10. The method according to claim 7, wherein the metal or the metal powder is selected from the group consisting of copper, aluminum, magnesium, and alloys based on these metals.

\* \* \* \* \*